(12) United States Patent
Riley et al.

(10) Patent No.: US 9,263,444 B2
(45) Date of Patent: Feb. 16, 2016

(54) DEVICES HAVING INHOMOGENEOUS SILICIDE SCHOTTKY BARRIER CONTACTS

(71) Applicant: Texas Instruments Incorporated, Dallas, TX (US)

(72) Inventors: Deborah Jean Riley, Murphy, TX (US); Judy Browder Shaw, Leonard, TX (US); Christopher L. Hinkle, Richardson, TX (US); Creighton T. Buie, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/472,007

(22) Filed: Aug. 28, 2014

(65) Prior Publication Data

US 2015/0061034 A1 Mar. 5, 2015

Related U.S. Application Data

(60) Provisional application No. 61/871,557, filed on Aug. 29, 2013.

(51) Int. Cl.
*H01L 23/00* (2006.01)
*H01L 27/092* (2006.01)
*H01L 21/8238* (2006.01)
*H01L 29/47* (2006.01)
*H01L 29/78* (2006.01)

(52) U.S. Cl.
CPC ...... *H01L 27/092* (2013.01); *H01L 21/823814* (2013.01); *H01L 21/823871* (2013.01); *H01L 29/47* (2013.01); *H01L 29/7839* (2013.01); *H01L 2924/12032* (2013.01); *H01L 2924/1305* (2013.01); *H01L 2924/13091* (2013.01)

(58) Field of Classification Search
CPC .............. H01L 2924/00; H01L 29/872; H01L 29/66143; H01L 21/823814; H01L 29/7839; H01L 29/0619
See application file for complete search history.

(56) References Cited

U.S. PATENT DOCUMENTS 7,504,328 B2 3/2009 Zhu et al.

*Primary Examiner* — Matthew Reames
*Assistant Examiner* — John Bodnar
(74) *Attorney, Agent, or Firm* — Jacqueline J. Garner; Frank D. Cimino

(57) ABSTRACT

A method of fabricating Schottky barrier contacts for an integrated circuit (IC). A substrate including a silicon including surface is provided having a plurality of transistors formed thereon, where the plurality of transistors include at least one exposed p-type surface region and at least one exposed n-type surface region on the silicon including surface. A plurality of metals are deposited including Yb and Pt to form at least one metal layer on the substrate. The metal layer is heated to induce formation of an inhomogeneous silicide layer including both Ptsilicide and Ybsilicide on the exposed p-type and n-type surface regions.

14 Claims, 4 Drawing Sheets

| DEPOSITED METAL | $\Phi_{bp}$ | $\Phi_{bn}$ | $\Phi_{bp} + \Phi_{bn}$ |
|---|---|---|---|
| Ni | 0.44 | 0.69 | 1.13 |
| Pt | 0.21 | 0.78 | 0.99 |
| $Ni_{0.9}Pt_{0.1}$ | 0.35 | 0.80 | 1.15 |
| Yb | 0.65 | 0.41 | 1.06 |
| 10 nm Yb THEN 10 nm Ni | 0.57 | 0.43 | 1.00 |
| 5 nm Yb THEN 15 nm $Ni_{0.9}Pt_{0.1}$ | 0.37 | 0.78 | 1.15 |
| 10 nm Yb THEN 10 nm $Ni_{0.9}Pt_{0.1}$ | 0.41 | 0.46 | 0.87 |

DEVICES HAVING INHOMOGENEOUS SILICIDE SCHOTTKY BARRIER CONTACTS

CROSS REFERENCE TO RELATED APPLICATIONS

This application claims the benefit of Provisional Application Ser. No. 61/871,557 entitled "DEVICES HAVING INHOMOGENEOUS SILICIDE SCHOTTKY BARRIER CONTACTS", filed on Aug. 29, 2013, which is herein incorporated by reference in its entirety.

FIELD

Disclosed embodiments relate to silicide Schottky Barrier contacts.

BACKGROUND

There is a significant interest in reducing contact resistivity (Rc) to improve the performance of semiconductor devices. For complementary metal-oxide-semiconductor (CMOS) transistors, Rc can contribute over 65% of the total on-state source to drain series resistance. One way to reduce Rc is to increase the junction doping level of the surface to be contacted. However, the junction doping is already near dopant solubility limits, so that further doping will not decrease Rc. Accordingly, the largest reduction in contact resistivity for sub-32 nm technology nodes available is likely to come from a reduction in Schottky barrier heights (SBH) at the Schottky barriers formed at the metal-semiconductor (MS) interfaces, where the SBH is the potential energy barrier for carriers at the MS interfaces formed at the source and drain contacts of the transistors.

At a metal/n-type semiconductor interface, the SBH is the difference between the conduction band minimum and the metal Fermi level. For a metal/p-type semiconductor interface, the SBH is the difference between the valence band maximum of the semiconductor and the metal Fermi level. The most common symbol used for the SBH is $\Phi_b$, with $\Phi_{bp}$ (for metal contact to a p-type semiconductor) and $\Phi_{bn}$ (for metal contact to an n-type semiconductor). Silicides are a class of compounds that includes silicon with usually ≥1 more electropositive metal element that provide the metal to form a MS interface with semiconductors such as silicon, such as at the source and drain of a MOS transistor.

One known solution to the silicide Rc issue is to use separate homogenous silicide materials (an "NMOS silicide" and a "PMOS silicide") for contact to the p-type semiconductor regions (the PMOS silicide) and n-type semiconductor regions (the NMOS silicide). As an example, Yb can be included in Nisilicide to provide a first homogenous silicide material (NMOS silicide) which can lower the electron SBH of the silicide for contacts to n-type Si, but not for contacts to p-type Si as it raises the hole SBH to p-type Si compared to Nisilicide. Accordingly, Pt can be included in Nisilicide to provide a second homogenous silicide material (a PMOS silicide) which lowers the hole SBH of the silicide on p-type Si (but raises the electron SBH on n-type Si) for contacts to p-type Si. However, this process adds a masking level to create the homogenous NMOS silicide and homogenous PMOS silicides independently, which also adds to process complexity and cost to manufacturing.

SUMMARY

Disclosed embodiments describe inhomogeneous silicides including both Ybsilicide and Ptsilicide for contacts to both p-type Si and n-type Si for integrated circuits (ICs). ICs that can benefit from disclosed embodiments include those that include contact to both n-type and p-type silicon comprising surfaces, including complementary metal-oxide-semiconductor (CMOS) circuitry, as well as junction gate field-effect transistors (JFETs) and bipolar transistors. Instead of using one or two conventional homogenous metal or metal alloy silicides for contacts to both n-type and p-type Si comprising surfaces on the IC, an inhomogeneous metal layer including both Ybsilicide and Ptsilicide is provided which unexpectedly has been found to provide separate electrically parallel low SBH paths for electrons (for contacts to n-type Si comprising surfaces) and holes (for contacts to p-type Si comprising surfaces).

For CMOS ICs, for example, electrons in NMOS source and drain contacts see a low barrier path provided by Ybsilicide, while holes in PMOS source and drain contacts take advantage of a low barrier path provided by Ptsilicide at the Si interface. Disclosed inhomogeneous silicides thus allow both a low SBH current path for electrons (provided by the Ybsilicide) and an electrically parallel low SBH current path for holes (provided by the Ptsilicide) using the same silicide material. Moreover, disclosed embodiments eliminate the need for the extra masking level conventionally required to create known separate silicides for contacts to n-type Si comprising surfaces and for contacts to p-type Si comprising surfaces to lower the SBH for both n-type and p-type contacts, which reduces process complexity and the cost of manufacturing.

BRIEF DESCRIPTION OF THE DRAWINGS

Reference will now be made to the accompanying drawings, which are not necessarily drawn to scale, wherein.

DETAILED DESCRIPTION

Figure 1:
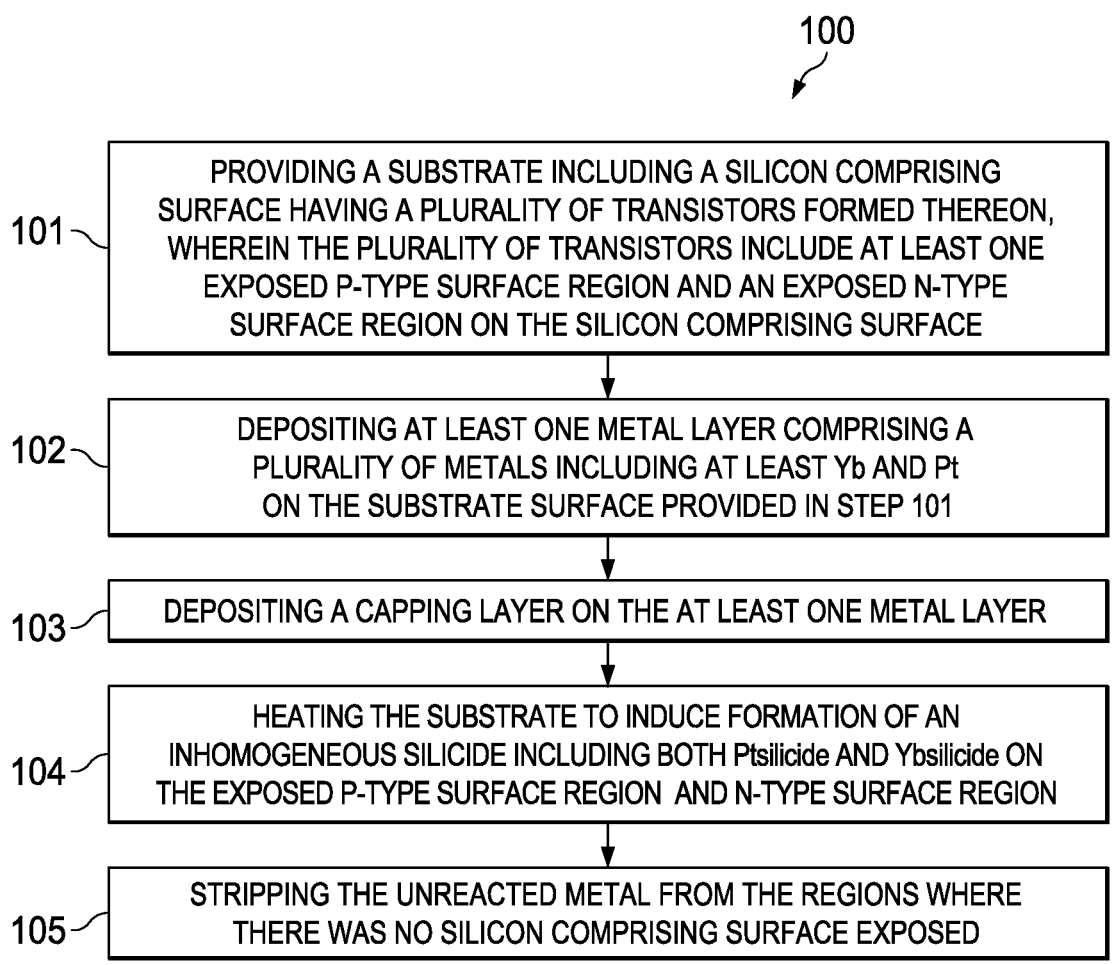
FIG. 1 is a flow chart that shows steps in an example method for forming inhomogeneous silicide Schottky barrier contacts including both Ybsilicide and Ptsilicide for contacting both n-type Si comprising surfaces and p-type Si comprising surfaces on an IC, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for forming inhomogeneous silicide Schottky barrier contacts including both Ybsilicide and Ptsilicide for contacting both n-type Si comprising surfaces and p-type Si comprising surfaces on an IC, according to an example embodiment. Step 101 comprises providing a substrate (e.g., a wafer including a plurality of IC die) including a silicon comprising surface having at least one p-type region to be contacted and at least one n-type region to be contacted.

In the case of a CMOS IC, there will be at least one PMOS region and at least one NMOS region. For ICs having bipolar transistors and/or JFETs, each of these transistors include at least one contact to an n-type Si comprising surface and at least one contact to a p-type Si comprising surface. For the CMOS IC, the PMOS regions include a first gate stack including a first gate electrode on a first gate dielectric therein, and exposed p-type surface regions including a p-type source and a p-type drain on opposing sides of the first gate stack. The NMOS regions include a second gate stack including a second gate electrode on a second gate dielectric therein, and exposed n-type surface regions including an n-type source and an n-type drain on opposing sides of the second gate stack. The substrate for forming disclosed ICs is generally provided in wafer form including a plurality (e.g., hundreds or thousands) of die.

In one embodiment, the substrate comprises a bulk silicon substrate, such as a lightly doped p-type or n-type substrate. Other types of substrates, such as silicon-on-insulator (SOI), silicon carbide or SiGe can also be used, as well as substrates with a different top semiconductor surface, such as SiGe on silicon.

The flow to form the substrate including a semiconductor surface with the various features provided in step 101 as known in the semiconductor fabrication arts is briefly described in a few paragraphs below for a CMOS IC. A gate dielectric may be formed on the semiconductor surface of the substrate, such as on an optional pwell or nwell formed in the semiconductor surface. The substrate at this point generally already has dielectric isolation regions, such as shallow trench isolation (STI). The gate dielectric layer can comprise materials such as silicon oxide, nitrogen doped silicon dioxide, silicon oxynitride, barium strontium titanate (BST), lead zirconate titanate (PZT), hafnium oxide or other Hi-k dielectric material, or any combination or stack thereof, such as being 1 to 3 nanometers thick. The gate electrode is then formed, such as comprised of polysilicon, later doped p-type for PMOS transistors and n-type for NMOS transistors. Spacers are then formed on the gate sidewalls, such as comprised of an oxide, a nitride, an oxynitride or a combination or stack thereof, thereby creating an offset spacer adjacent to the gate stacks.

Lightly doped drains (LDDs) may be provided for both NMOS transistors and PMOS transistors. Regions of pocket dopant can be formed as LDDs. Source/drain spacers on the sidewalls of the gate electrode are then generally formed. The source/drain spacers can comprise an oxide/nitride stack, but alternatively can comprise an oxide, a nitride, an oxynitride, or any suitable material. Source and drain are then formed for PMOS transistors and NMOS transistors.

The source-drain formation step may also include typical process modifications to create embedded silicon germanium (SiGe) stressor regions in PMOS transistors and/or heavily doped silicon epi/embedded SiC stressor regions in the NMOS transistors. These embedded stressors in the source and drain regions impart stress to the transistor channel enhancing NMOS and PMOS transistors performance. An annealing step which may be referred to as a source/drain anneal generally follows, which can be preceded by a stress memorization layer (SMT) typically nitride/oxide deposition. During the annealing step the SMT transfers stress to the NMOS transistors in the die increasing their performance. The SMT layer is then removed. Alternatively, the source/drain spacers are removed after source-drain region formation for improving PMD gap fill.

The optional step of replacement gate processing can follow. The original gate electrodes, such as polysilicon gate electrodes, for at least one of the PMOS transistors and the NMOS transistors, can be removed following the source/drain anneal to form gate trenches using a suitable etch process.

The substrate surface provided in step 101 includes both exposed areas of the silicon comprising surface and areas that are not exposed. For example, a patterned hard mask material such as an oxide (e.g., silicon oxide) or a nitride (e.g., silicon nitride) can be used to provide openings to provide exposed areas of the silicon comprising surface while the hard mask areas can provide covered (non-exposed) areas silicon comprising surface. As described below, on completed ICs, despite a blanket metal deposition silicide deposition generally being used, after heating the silicide, silicide only forms on the exposed areas of the silicon comprising surface allowing the stripping of unreacted metal from the hard mask regions where the silicon comprising surface was not exposed.

A pre-silicide clean may then be performed. The pre-silicide clean, for example, can comprise wet cleaning using a dilute HF aqueous solution, or can comprise dry cleaning using a plasma (e.g., a $NF_3/NH_3$ plasma), or can comprise a combination of both the above. Other clean chemistries or processes are can also be used. The pre-silicide clean prepares the surfaces for metal deposition by removing any thin "native" oxide on the gate (for silicon gate embodiments) and on the source/drain regions.

Step 102 comprises depositing at least one metal layer comprising a plurality of metals including at least Yb and Pt on the substrate surface provided in step 101. The deposition is generally a blanket sputter deposition performed under high vacuum (e.g., a base pressure<$5 \times 10^{-7}$ torr). The depositing can comprise depositing a Yb interlayer followed by a depositing a layer including Pt (sequentially deposited), generally without breaking vacuum, using a sputtering system. The depositing can also comprises co-depositing Yb and Pt. In one embodiment the depositing further includes at least one more metal other than Yb and Pt, such as Ni, Ti, Co, or W. Molecular beam epitaxy (MBE), chemical vapor deposition (CVD), or Atomic Layer Deposition (ALD) may also be used as an alternative to sputtering.

Step 103 comprises depositing a capping layer on the at least one metal layer. The capping layer prevents oxidation of Yb and can improve the film quality. The capping layer may be skipped if vacuum annealing in step 104 described below is used. The capping layer can comprise a refractory metal or refractory metal compound capping layer, such as TiN or TaN. Deposition techniques for depositing the capping layer include CVD and ALD.

Step 104 comprises heating the substrate to induce formation of an inhomogeneous silicide layer including both Ptsilicide and Ybsilicide on the exposed n-type and p-type regions of the silicon comprising surface. One example heating process is a rapid thermal processing (RTP) which as used herein refers generally to a semiconductor manufacturing process which heats wafers from 240° C. to 600° C. on a timescale of seconds to about one minute. A conventional furnace anneal may also be used for the heating, such as heating the wafer in forming gas ($H_2/N_2$) at a temperature between about 240° C. and 550° C. for about 1 hour. The thickness for the inhomogeneous silicide layer is generally 8 nm to 30 nm, which can be modified to be thinner or thicker than this range by changing the metal layer thicknesses (step 102), and/or the heating (step 104) used for silicide formation.

Step 105 comprises stripping of unreacted metal from the regions where there was no exposed silicon comprising surface so that no silicide was formed there during the heating step. Unreacted metal and the capping layer material may both be removed, for example, by wet cleaning (e.g., a sulfuric peroxide mixture (SPM) or an ammonium peroxide mixture (APM)).

In one alternate embodiment, rather than a single heating step (step 104), forming the inhomogeneous silicide layer can involve two separate heating steps. As with method 100, a pre-silicide clean is followed by metal deposition (analogous to step 102). A first heating step generally being an RTP is then performed at a temperature that is typically in the range of 240° C. to 300° C., such as for 30 to 60 seconds, to form an initial silicide phase. The unreacted metal is stripped off, such as using SPM or APM (analogous to step 105). A second heating process is then included to transition the initial silicide phase to the final inhomogeneous silicide phase. This second heating step is typically an RTP process performed at a significantly higher temp than the first heating step (generally≥100° C. more) and with a shorter time (e.g., about 1 second, or less) as compared to the first heating step. The second heating step allows the final silicide phase to be formed without allowing any measurable deactivation of dopants, any diffusion of silicidation materials, or any agglomeration of silicide materials.

The method continues by forming interconnections to the contacts of the NMOS and PMOS transistors including the inhomogeneous silicide contacts, such as tungsten for filling contact holes in a pre-metal dielectric layer, followed by depositing an electrically conductive metal material, such as copper. For example, thereafter, a dielectric layer may be deposited and patterned to create vias and trenches. The vias and trenches are then filled with electrically conductive material, such as copper, to form metal interconnects. Further processes are performed to complete the IC, for example, additional interconnect levels, passivation, until the final structure of the IC is completed. Dicing and packaging generally follow.

Figure 2:
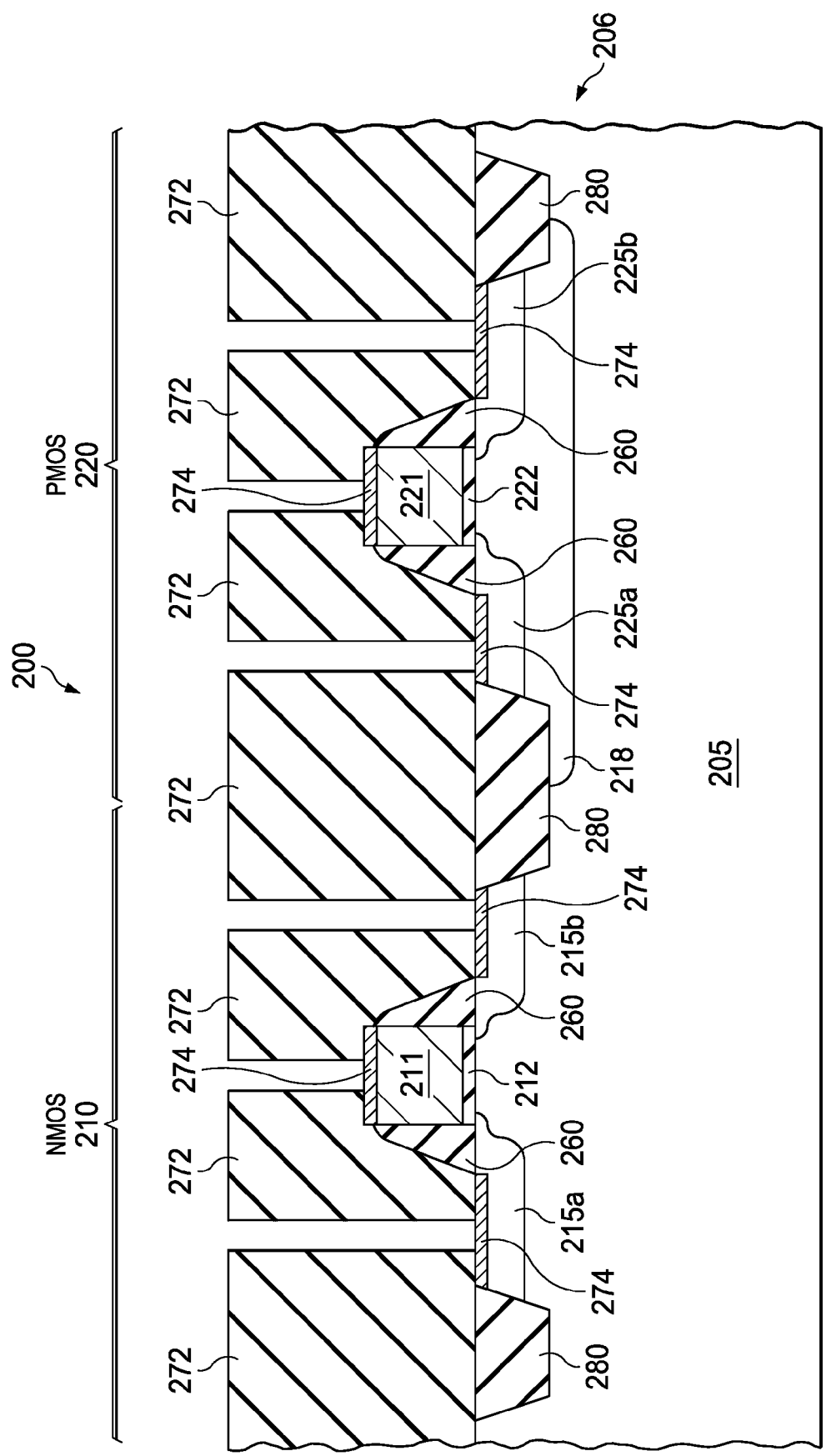
FIG. 2 is a cross sectional view of a CMOS IC having polysilicon gate MOS transistors including disclosed inhomogeneous silicide Schottky barrier contacts including both Ybsilicide and Ptsilicide, according to an example embodiment.

FIG. 2 shows a portion of an IC 200 in accordance with an example embodiment including a polysilicon gate NMOS transistor 210 and a polysilicon gate PMOS transistor 220 in a top (e.g., p-type) semiconductor surface 206 of a substrate 205, having the same inhomogeneous silicide Schottky barrier layer 274 for both p-type PMOS and n-type NMOS contacts. Substrate 205 as shown is a p-type substrate. An nwell 218 is formed in the top semiconductor surface 206 and the PMOS transistor 220 is formed in the nwell 218. Although the portion of the IC 200 shows only a single NMOS transistor 210 and a single PMOS transistor 220, in a typical CMOS IC, there are generally a plurality of both high voltage gate (HVG) transistors (e.g., 3.3 volt devices), a plurality of low voltage transistors (e.g., 1 volt devices), as well as some passive elements such as resistors and capacitors.

Metallization and passivation are not shown in FIG. 2 for simplicity. Dielectric isolation is provided by the STI regions 280 shown. However, any conventional isolation structure may generally be used such as field oxidation regions (also known as (LOCal Oxidation of Silicon (LOCOS) regions) or implanted (junction) isolation regions.

The contacts to the gate electrode 211, source 215a and drain 215b for NMOS transistor 210 and contacts to the gate electrode 221, source 225a and drain 225b for PMOS transistor 220 include vias in a pre-metal dielectric layer 272 all to the same disclosed inhomogeneous silicide Schottky barrier layer 274 thereon. NMOS transistor 210 includes gate dielectric 212 and PMOS transistor 220 includes gate dielectric 222, which can be the same or different dielectric materials. The gate electrode stack for the NMOS transistor 210 and PMOS transistor 220 can comprise polysilicon and the gate dielectric a thermal oxide or a nitrided thermal oxide.

Alternatively, although not shown, the gate stacks for NMOS 210 and PMOS 220 can comprise a metal gate electrode on a Hi-k gate dielectric, and a barrier metal generally on the Hi-k gate dielectric which frames the metal gate electrode. As used herein, a Hi-k dielectric material refers to a dielectric material having a high relative dielectric constant κ as compared to silicon dioxide which has a κ value of about 3.9. Typical Hi-k dielectrics provide κ values of at least 5.

Spacers 260 are on the sidewalls of the respective gate stacks 211/212 and 221/222. The spacers 260 generally comprise at least one dielectric material.

NMOS 210 includes source 215a and drain 215b located adjacent to the gate stack 211/212 in the semiconductor surface 206. The source/drain 215a and 215b for NMOS 210 are heavily doped with n-type dopants and generally include the lightly doped drain (LDD) extensions shown. The doped regions can be formed by ion implantation. PMOS 220 includes source 225a and drain 225b located adjacent to the gate stack 221/222 in the nwell 218. The source/drain 225a and 225b are heavily doped with p-type dopants and generally include the LDD extensions shown. The respective doped regions can be formed by ion implantation.

Although not shown, NMOS 210 can also include raised source/drain regions which in one particular embodiment can be carbon doped (e.g., SiC). Moreover, PMOS 220 can also include embedded source/drain regions, such as comprising SiGe.

EXAMPLES

Disclosed embodiments are further illustrated by the following specific Examples, which should not be construed as limiting the scope or content of this Disclosure in any way, such as the inclusion of Ni in disclosed methods so that the inhomogeneous silicide layer includes Nisilicide in addition to both Ptsilicide and Ybsilicide. A third transition metal is only optional. Moreover, if included, the third transition metal silicide can also be a Tisilicide, Cosilicide (cobalt silicide), or Wsilicide, or even two or more additional transition metal silicides.

Figures 3A, 3B:
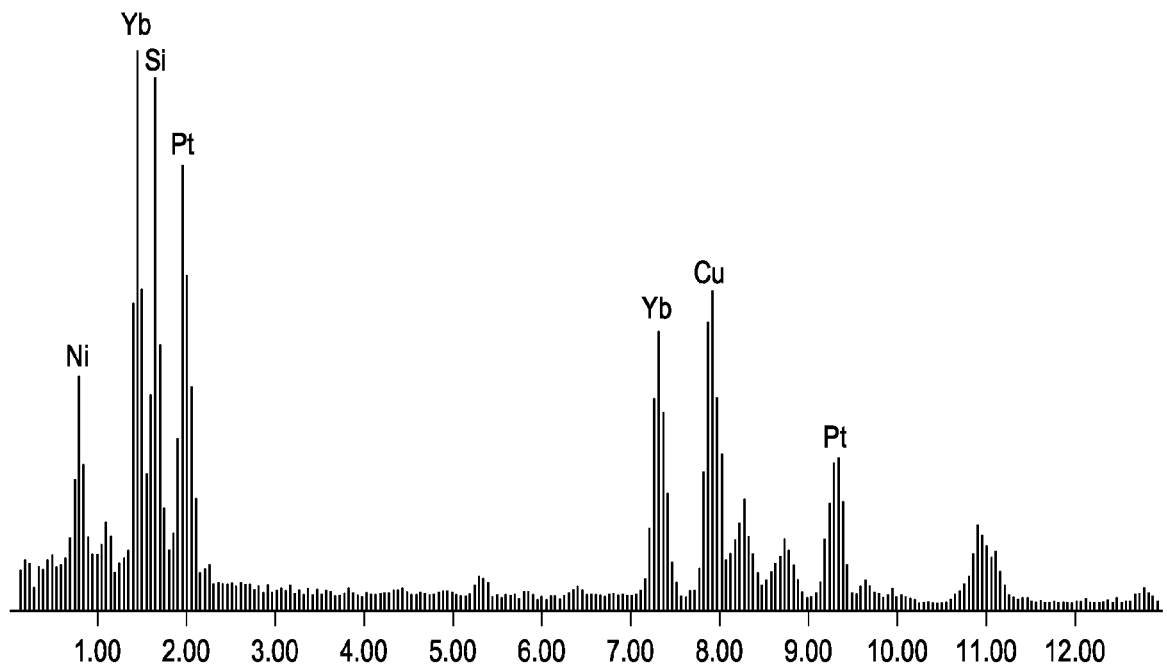
FIG. 3A shows results from energy-dispersive X-ray spectroscopy (EDS) of an example YbNiPtSi inhomogeneous silicide layer evidencing Ybsilicide, Ptsilicide and Nisilicide.
FIG. 3B is a data table having the measured SBH for a disclosed inhomogeneous silicide layer to p-type and n-type contacts which evidences that there are at least two different silicides present in the inhomogeneous silicide layer described relative to FIG. 3A.

FIG. 3A shows results from energy-dispersive X-ray spectroscopy (EDS) of an example YbNiPtSi inhomogeneous silicide layer formed by vacuum sputter depositing a 10 nm Yb interlayer on a silicon wafer followed by vacuum sputter depositing 10 nm of $Ni_{0.9}Pt_{0.1}$, deposition of a capping layer, then RTP at 460° C. for 30 s. The total inhomogeneous silicide layer thickness after the RTP anneal was measured to be about 20 nm.

Over a spot size of about 3 nm, Ybsilicide, Ptsilicide, and Nisilicide can all be seen to be detected by EDS. Multiple ~3 nm spot size measurements were performed across the sample which all showed very similar EDS results. This data evidences the unexpected result that all 3 silicides (Ybsilicide, Nisilicide and Ptsilicide) were present and were each uniformly distributed throughout the sample, and are thus scalable for small area contacts. Calculations showed the silicide present to comprise ~35% Ybsilicide, 42% Nisilicide, and 23% Ptsilicide. There was no detected unreacted YbNiPt remaining. Moreover, after a 2 hour 400° C. anneal that represents the back end-of-the-line (BEOL) heat cycling including packaging, the sample was found to not have any detectable change in morphology or composition, evidencing disclosed inhomogeneous silicide layers are stable through typical BEOL processing.

FIG. 3B is a data table having measured SBHs (in eVs) for p-type and n-type contacts shown which evidences that there are at least two different silicides present in the disclosed inhomogeneous silicide layer described relative to FIG. 3A shown in line 7 of FIG. 3B as the "10 nm Yb then 10 nm $Ni_{0.9}Pt_{0.1}$". The first six entries in this data table evidence conventional single homogenous silicides, where the SBH measured for holes and for electrons can be seen to sum together to the silicon 25° C. band gap of about 1.1 eV. For example, it can be seen if just Ni or Pt or Yb is used, the two SBH's ($\Phi_{bp}$ and $\Phi_{bn}$) together sum to about ~1.1 eV (thus being within measurement error of the silicon 25° C. band gap of about 1.1 eV).

Disclosed embodiments recognize both Yb and Pt tend to diffuse and "pile-up" or segregate at the Si/silicide interface, while Ni does not do so or does so significantly less. When both Pt and Yb are present, the Pt tends to "win" the pile-up all else being equal. As a result, for the sample shown in line 5 of FIG. 3B with no Pt present, the SBHs are primarily set by the presence of YbSi as the dominant species at the interface (there may be some parallel conduction since the $\Phi_{bp}$ value is slightly lower than it is for pure YbSi, but not much parallel conduction). For the sample shown in line 6, the Yb interlayer that is too thin to prevent significant Pt diffusion and segregation and PtSi being the dominant interfacial species, so that this stack ends up being very much like the $Ni_{0.9}Pt_{0.1}$ sample stack.

For the disclosed "10 nm Yb then 10 nm $Ni_{0.9}Pt_{0.1}$" sample shown in line 7, the Yb interlayer is in a range of proper thickness to allow the right amount of Pt diffusion to get approximately equal concentrations of YbSi and PtSi to reside at the junction interface providing the parallel conduction paths. For this disclosed sample there is apparently sufficient Yb together with Ni and Pt so that the SBHs no longer sum to silicon band gap of about 1.1 eV, being $\Phi_{bp}$=0.41 eV, $\Phi_{bn}$=0.46 eV (a total combined SBH of 0.87 eV). This is believed to evidence electrons and the holes are traveling through separate materials, and there are (at least) two unique electrically parallel conduction paths being followed at the same Schottky contact. However, although this mechanism (or any other mechanism described herein) is believed to explain the observed phenomena, disclosed embodiments may be practiced independent of the particular mechanism(s) that may be operable.

Figure 4:
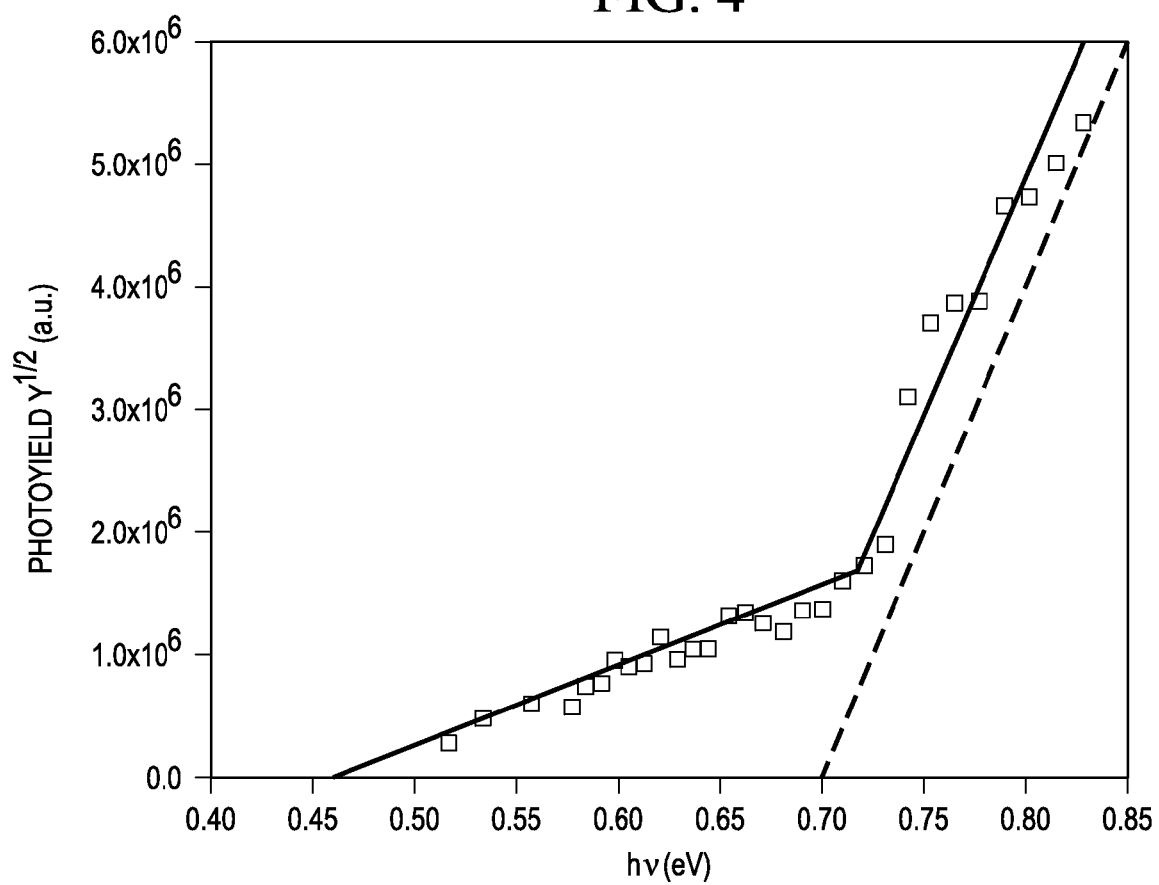
FIG. 4 shows a representative internal photoemission (IPE) measurement under zero bias at room temperature for a disclosed YbNiPtSi sample on a silicon surface that evidences the presence of multiple resolved Schottky barriers.

SBH's were also measured using internal photoemission (IPE) under zero bias at room temperature. FIG. 4 shows a representative IPE measurement from a disclosed YbNiPtSi sample on a HF-cleaned n-type silicon (100) surface doped around $1\times10^{15}$ cm$^{-3}$ which provided a Schottky barrier diode. The number of photo-induced carriers generated by the incoming photons per unit time, i.e. the quantum yield, is given by $Y=C(h\upsilon-\phi_b)^2$, where C is a constant, by is the photon energy, and $\phi_b$ is the SBH. The SBH can be extracted from the x-intercept by plotting $\sqrt{Y}$ vs. $h\upsilon$.

The increased slope beginning in the middle of the data shown in FIG. 4 (from about 0.7 eV) evidences the unexpected result being multiple parallel and independent SBHs (first SBH and second SBH) within the area of these diodes. When the photon energy is higher than the second SBH, both barriers contribute to the photocurrent. However, when the photon energy is below the second SBH, photo electrons generated in the metal do not have high enough energy to overcome that barrier and, as a result, the photocurrent measured in this energy range is due only to the first SBH. It is this cut-off of additional Y that allows the measurement of distinct SBHs and correlation with the observed I-V measurements. Although the data in FIG. 4 evidences resolved first and second (YbSi and NiSi) Schottky barriers, the third (PtSi) Schottky barrier although present was unresolvable because of a low quantum yield relative to the first two barriers. Other disclosed YbNiPtSi samples having IPE measured under different conditions evidenced separately resolved NiSi and PtSi.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of fabricating Schottky barrier contacts for a complementary metal-oxide-semiconductor (CMOS) integrated circuit (IC), comprising:
    providing a substrate including a silicon comprising surface having at least one PMOS region including a first gate stack including a first gate electrode on a first gate dielectric therein and exposed p-type surface regions including a p-type source and p-type drain on opposing sides of said first gate stack
    and at least one NMOS region including a second gate stack including a second gate electrode on a second gate dielectric therein and an exposed n-type surface regions including an n-type source and n-type drain on opposing sides of said second gate stack,
    depositing a plurality of metals including Yb and Pt to form at least one metal layer on said substrate, and
    heating said metal layer to induce formation of an inhomogeneous silicide layer including both Pt silicide and Yb silicide on both of said exposed p-type surface regions and said exposed n-type surface regions.

2. The method of claim 1, wherein said first gate electrode and said second gate electrode comprise polysilicon and provide exposed areas so that said heating induces said formation of said inhomogeneous silicide layer on said first and said second gate electrodes.

3. The method of claim 1, wherein said depositing said plurality of metals further includes depositing at least one of Ni, Ti, Co, and W.

4. The method of claim 1, further comprising depositing a capping layer on said metal layer before said heating.

5. The method of claim 1, wherein depositing said plurality of metals comprises depositing a Yb interlayer followed by a depositing a layer including said Pt.

6. The method of claim 1, wherein said depositing said plurality of metals comprises simultaneously depositing said Yb and said Pt.

7. The method of claim 1, wherein a thickness of said inhomogeneous silicide layer is between 8 nm and 30 nm.

8. A method of fabricating Schottky barrier contacts for an integrated circuit (IC), comprising:
- providing a substrate including a silicon comprising surface having a plurality of transistors formed thereon, said plurality of transistors including at least one exposed p-type surface region and at least one exposed n-type surface region on said silicon comprising surface, depositing a plurality of metals including Yb and Pt to form at least one metal layer on said substrate, and
- heating said metal layer to induce formation of an inhomogeneous silicide layer including both Pt silicide and Yb silicide on both of said exposed n-type surface region and said exposed p-type surface region.

9. The method of claim 8, wherein said depositing said plurality of metals further includes depositing at least one of Ni, Ti, Co, and W.

10. An integrated circuit (IC), comprising:
- a substrate having a silicon comprising surface;
- a plurality of transistors formed on said silicon comprising surface, said plurality of transistors including at least one p-type surface region and at least one n-type surface region, and
- Schottky barrier contacts to said p-type surface region and said n-type surface region comprising an inhomogeneous silicide layer including both PtSi and YbSi.

11. The IC of claim 10, wherein said inhomogeneous silicide layer further comprises at least one of Ni, Ti, Co, and W.

12. The IC of claim 10, wherein a thickness of said inhomogeneous silicide layer is between 8 nm and 30 nm.

13. The IC of claim 10, wherein said plurality of transistors include:
- at least one NMOS transistor formed in said silicon comprising surface including a first gate stack including a first gate electrode on a first gate dielectric, and said n-type surface region includes an n-type source and n-type drain on opposing sides of said first gate stack, and
- at least one PMOS transistor formed in said silicon comprising surface including a second gate stack including a second gate electrode on a second gate dielectric, and said p-type surface region includes a p-type source and a p-type drain on opposing sides of said second gate stack, and
- wherein said Schottky barrier contacts are to said n-type source and drain of said NMOS transistor and to said p-type source and drain of said PMOS transistor.

14. The IC of claim 13, wherein said first gate electrode and said second gate electrode both comprise polysilicon and said inhomogeneous silicide layer provides a contact to said first gate electrode and said second gate electrode.

* * * * *